(12) United States Patent
Wang et al.

(10) Patent No.: US 6,444,921 B1
(45) Date of Patent: Sep. 3, 2002

(54) REDUCED STRESS AND ZERO STRESS INTERPOSERS FOR INTEGRATED-CIRCUIT CHIPS, MULTICHIP SUBSTRATES, AND THE LIKE

(75) Inventors: Wen-chou Vincent Wang, Cupertino; Michael G. Lee, San Jose; Solomon Beilin, San Carlos, all of CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/497,542

(22) Filed: Feb. 3, 2000

(51) Int. Cl.[7] .................................................. H05K 1/16

(52) U.S. Cl. ..................... 174/260; 174/254; 439/91

(58) Field of Search .................... 174/260, 261, 174/254; 361/748, 749, 750, 751, 784, 789; 439/91

(56) References Cited

U.S. PATENT DOCUMENTS

| | | | |
|---|---|---|---|
| 3,795,037 A | 3/1974 | Luttmer ........................ 29/268 |
| 4,271,588 A | 6/1981 | Nowak ......................... 29/827 |
| 4,547,834 A | 10/1985 | Dumont et al. ............. 361/382 |
| 4,648,179 A | 3/1987 | Bhattacharyya et al. ...... 29/832 |
| 4,664,309 A | 5/1987 | Allen et al. ............ 228/180.22 |
| 4,755,417 A | 7/1988 | Detoma ....................... 428/209 |
| 4,783,722 A | 11/1988 | Osaki et al. ................. 361/411 |
| 4,800,461 A | 1/1989 | Dixon et al. ................. 361/779 |
| 4,858,077 A | 8/1989 | Shinohara et al. .......... 361/683 |
| 4,897,918 A | 2/1990 | Osaka et al. ................. 29/830 |
| 4,954,877 A | 9/1990 | Nakanishi et al. ........... 257/659 |
| 4,954,878 A | 9/1990 | Fox et al. .................... 257/675 |
| 5,065,227 A | 11/1991 | Frankeny et al. ............ 357/778 |
| 5,100,492 A | 3/1992 | Kober et al. ................. 156/250 |
| 5,177,594 A | 1/1993 | Chance et al. ............... 257/678 |
| 5,199,163 A | 4/1993 | Ehrenberg et al. ............. 29/830 |
| 5,264,065 A | 11/1993 | Kohm ...................... 156/307.4 |
| 5,306,571 A | 4/1994 | Dolowy, Jr. et al. ........ 428/608 |
| 5,378,306 A | 1/1995 | Cibulsky et al. ............... 216/20 |
| 5,426,072 A | 6/1995 | Finnila ........................ 438/107 |
| 5,428,190 A | 6/1995 | Stopperan .................... 174/261 |
| 5,429,879 A | 7/1995 | Syn et al. .................... 428/614 |
| 5,474,458 A | 12/1995 | Vafi et al. ...................... 439/91 |
| 5,478,972 A | 12/1995 | Mizutani et al. ............. 174/250 |
| 5,483,421 A * | 1/1996 | Gedney et al. .............. 361/771 |
| 5,499,444 A | 3/1996 | Doanne, Jr. et al. .......... 29/830 |
| 5,530,288 A | 6/1996 | Stone .......................... 257/700 |
| 5,544,017 A | 8/1996 | Beilin et al. ................. 361/790 |

(List continued on next page.)

Primary Examiner—Kamand Cuneo
(74) Attorney, Agent, or Firm—Coudert Brothers LLP

(57) ABSTRACT

Disclosed is an interposer for electrically coupling two electrical components having different coefficients of thermal expansion (CTEs). The interposer has two substrates which have different CTE values, with each substrate having a first surface and a second surface. The interposer has electrical connectors located on the first surfaces of the two substrates, the connectors for making electrical connections to the two corresponding electrical components. A flexible-circuit layer is disposed between the two substrates and interconnects the connectors on the first substrate to the connectors on the second substrate. The two substrates are folded such that their second surfaces confront one another, where they may be attached to one another. General methods of making interposers for electrically coupling two electrical components are disclosed. A first substrate and a sacrificial substrate are encapsulated in an encapsulant material to form a composite substrate, with a second substrate being formed from the cured encapsulate material. Alternatively, the second substrate may be provided by a separate substrate that is encapsulated along with the first substrate and the sacrificial substrate. The surfaces of the composite substrate are polished, and a dielectric layer is formed over a polished surface of the composite substrate. A plurality of electrical traces are formed over the dielectric film. A portion of the composite substrate at its back surface is removed to expose a surface of the sacrificial substrate, and the sacrificial substrate is removed.

39 Claims, 9 Drawing Sheets

U.S. PATENT DOCUMENTS

| | | | |
|---|---|---|---|
| 5,573,428 A | | 11/1996 | Biggs et al. ................. 439/566 |
| 5,575,630 A | * | 11/1996 | Kresge et al. ............... 361/792 |
| 5,590,460 A | | 1/1997 | DiStefano et al. ............ 29/830 |
| 5,591,519 A | | 1/1997 | Caron et al. ................ 428/344 |
| 5,627,405 A | | 5/1997 | Chillara ...................... 257/668 |
| 5,659,153 A | | 8/1997 | Narayan et al. ............ 175/255 |
| 5,665,650 A | | 9/1997 | Lauffer et al. ................ 216/20 |
| 5,678,287 A | | 10/1997 | Smith et al. ........... 228/180.22 |
| 5,682,061 A | | 10/1997 | Khandros et al. ............ 257/666 |
| 5,688,584 A | | 11/1997 | Casson et al. ............... 428/209 |
| 5,691,041 A | | 11/1997 | Frankeny et al. ............ 428/209 |
| 5,745,986 A | | 5/1998 | Variot et al. ................... 29/840 |
| 6,064,576 A | * | 5/2000 | Edwards et al. ............ 361/776 |
| 6,118,671 A | * | 9/2000 | Tanel et al. ................. 361/795 |
| 6,191,952 B1 | * | 2/2001 | Jimarez et al. ............. 361/771 |
| 6,259,037 B1 | * | 7/2001 | Fellchenfeld et al. ....... 174/260 |

* cited by examiner

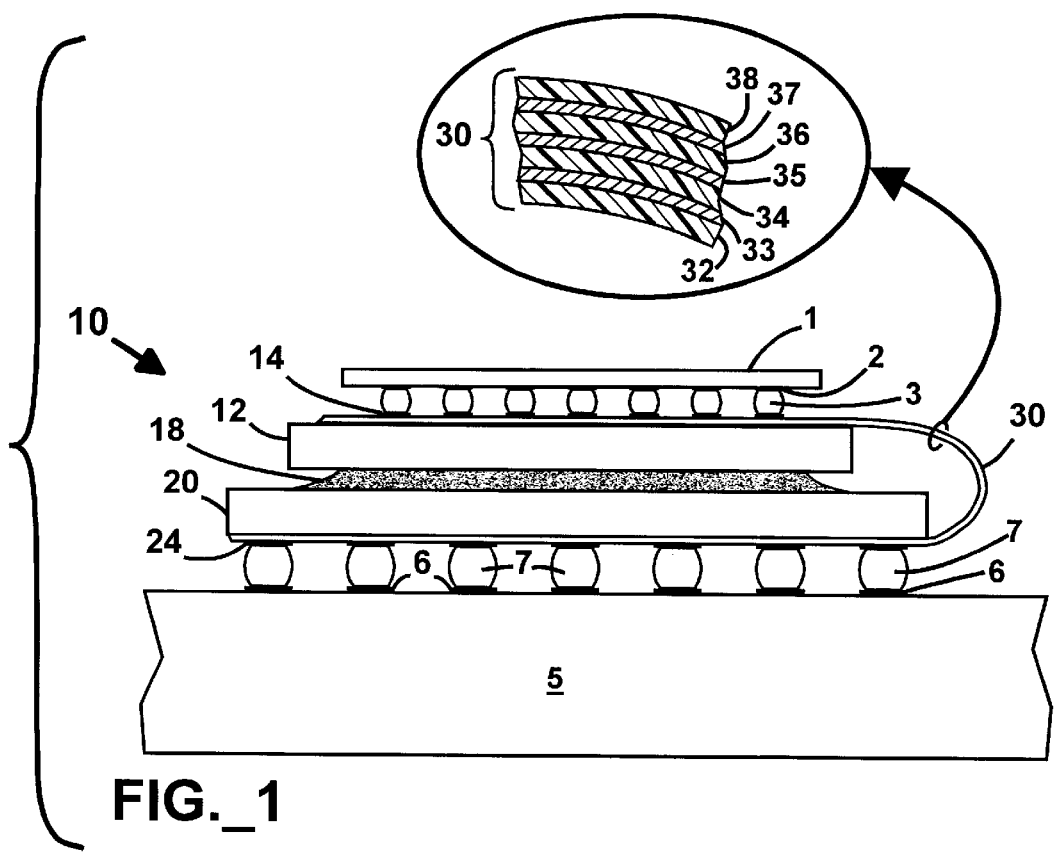
FIG._1
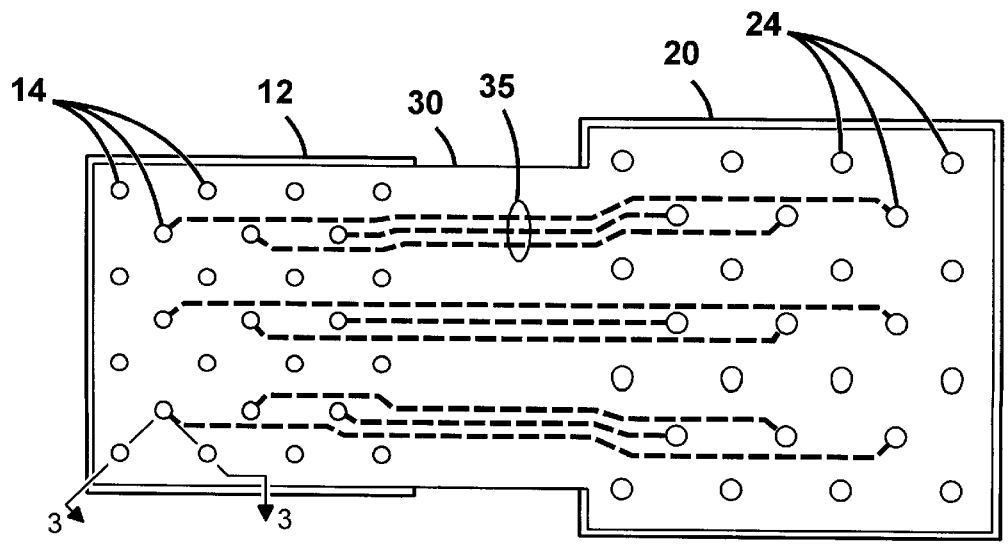
FIG._2

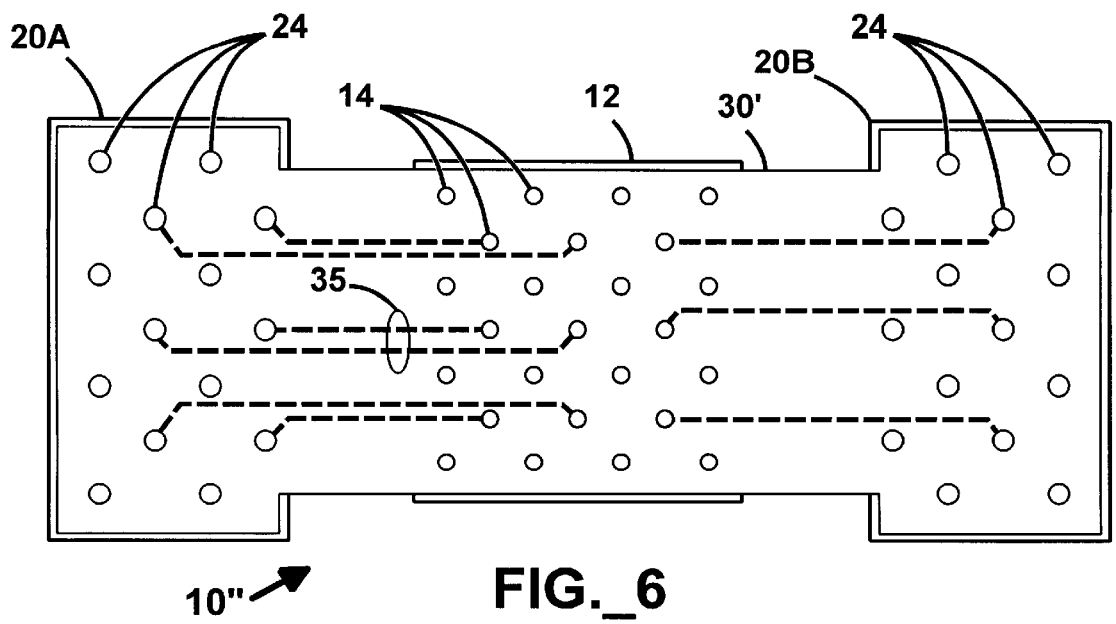
FIG._6
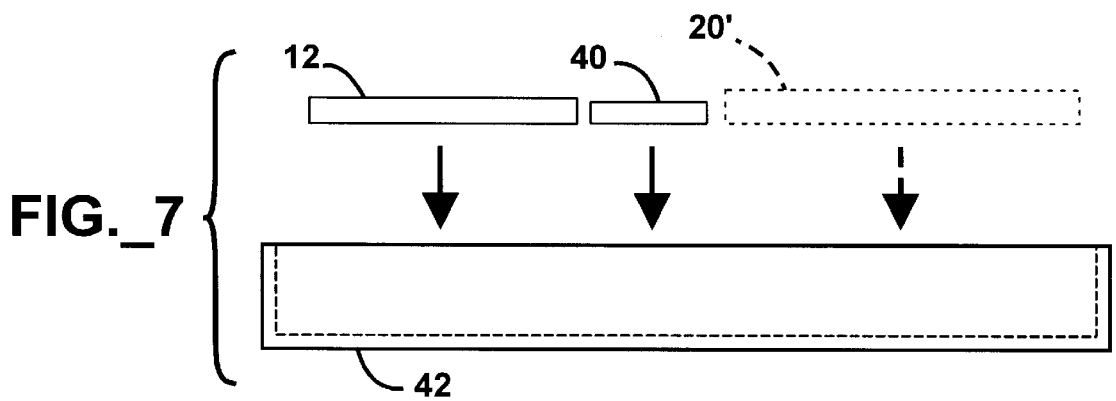
FIG._7
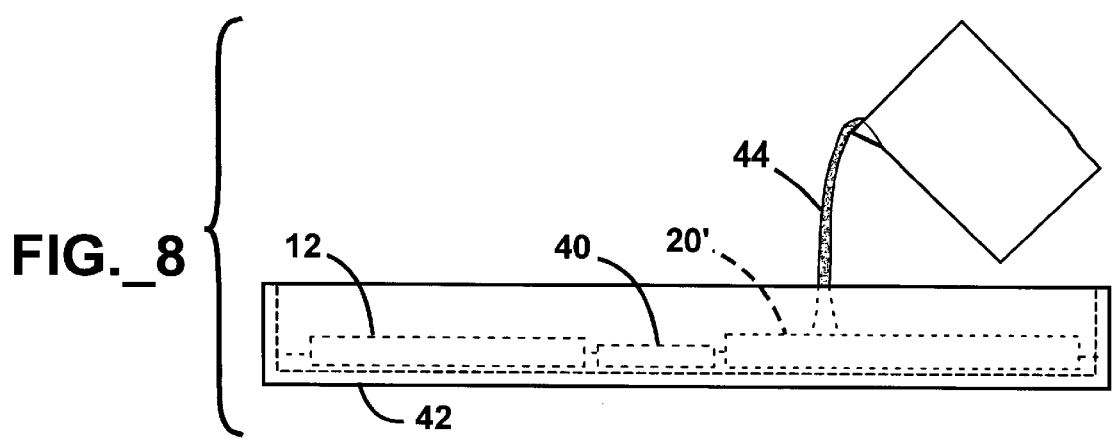
FIG._8

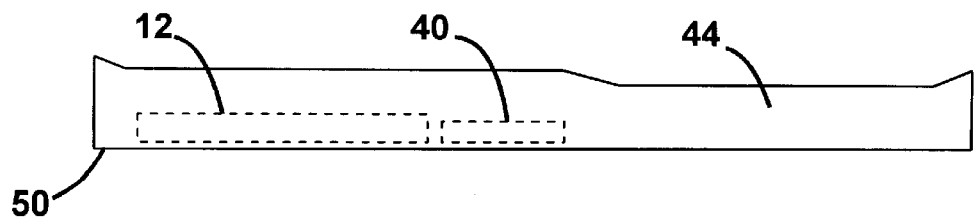
FIG._9
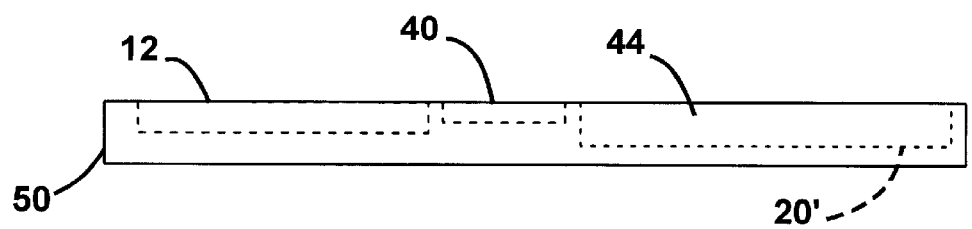
FIG._10
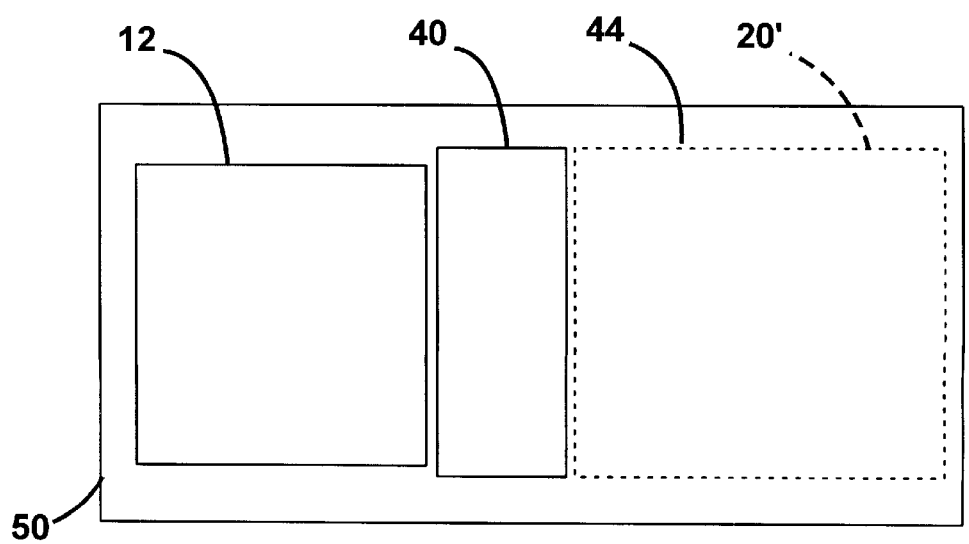
FIG._11

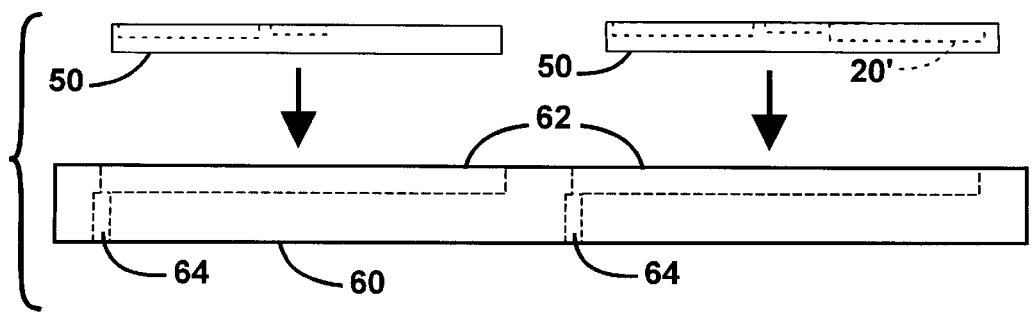
FIG._12
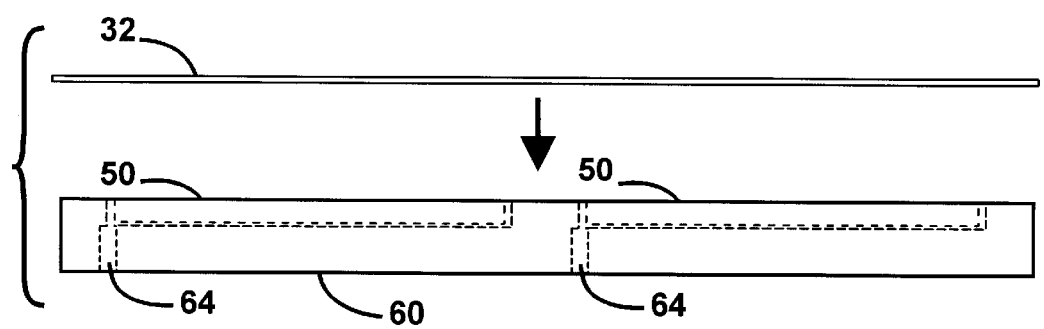
FIG._13
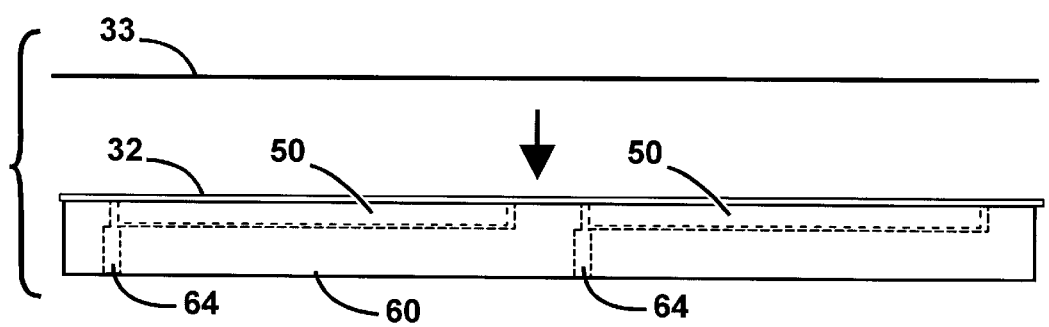
FIG._14

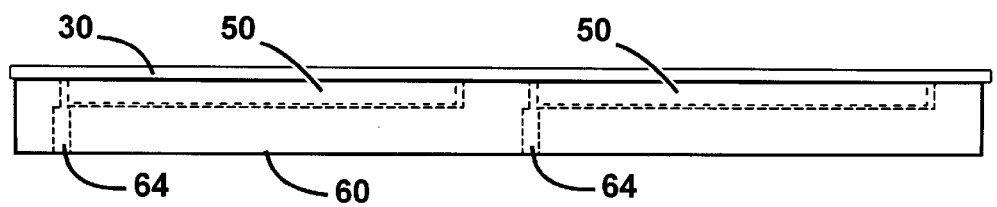
FIG._15
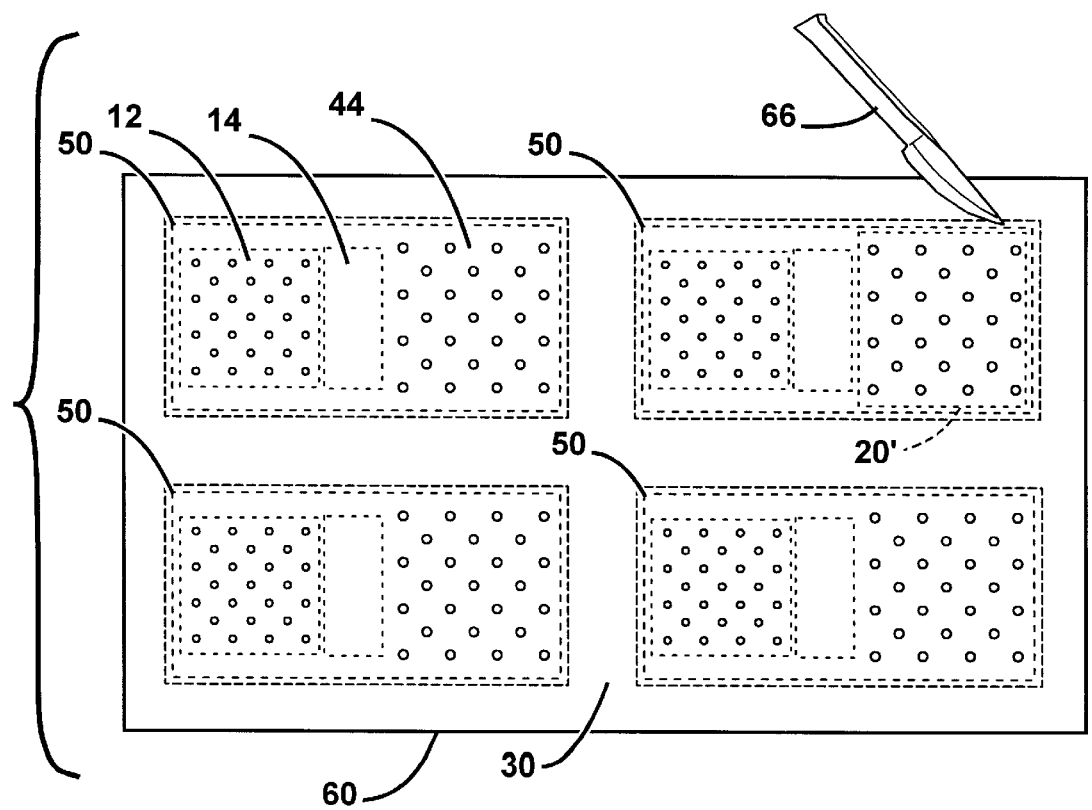
FIG._16

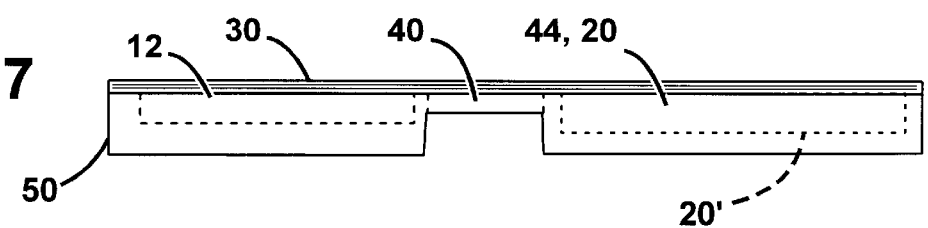
FIG._17
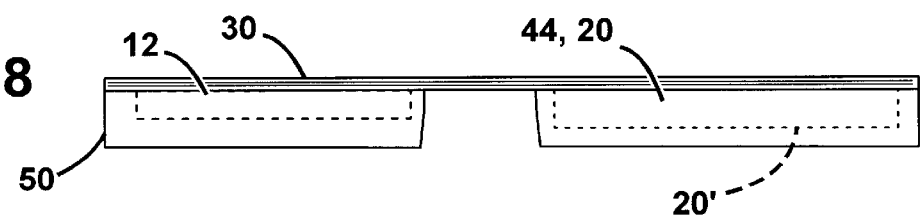
FIG._18
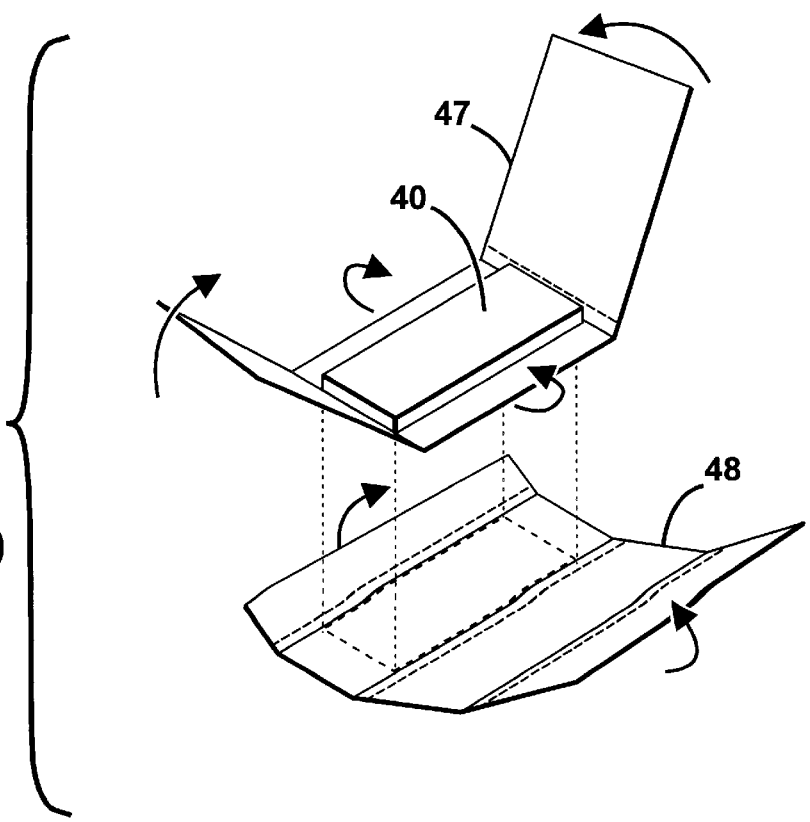
FIG._19

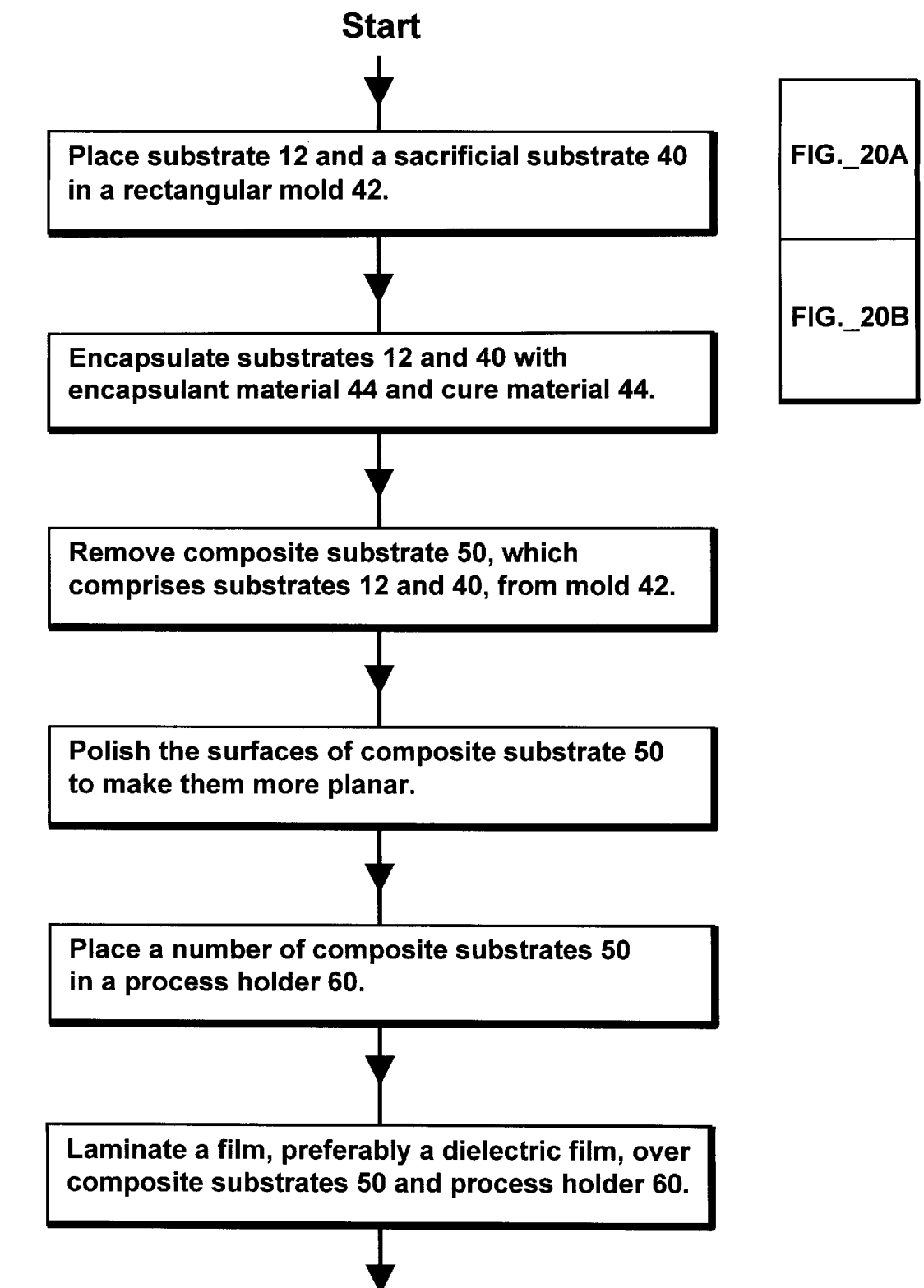
FIG._20A

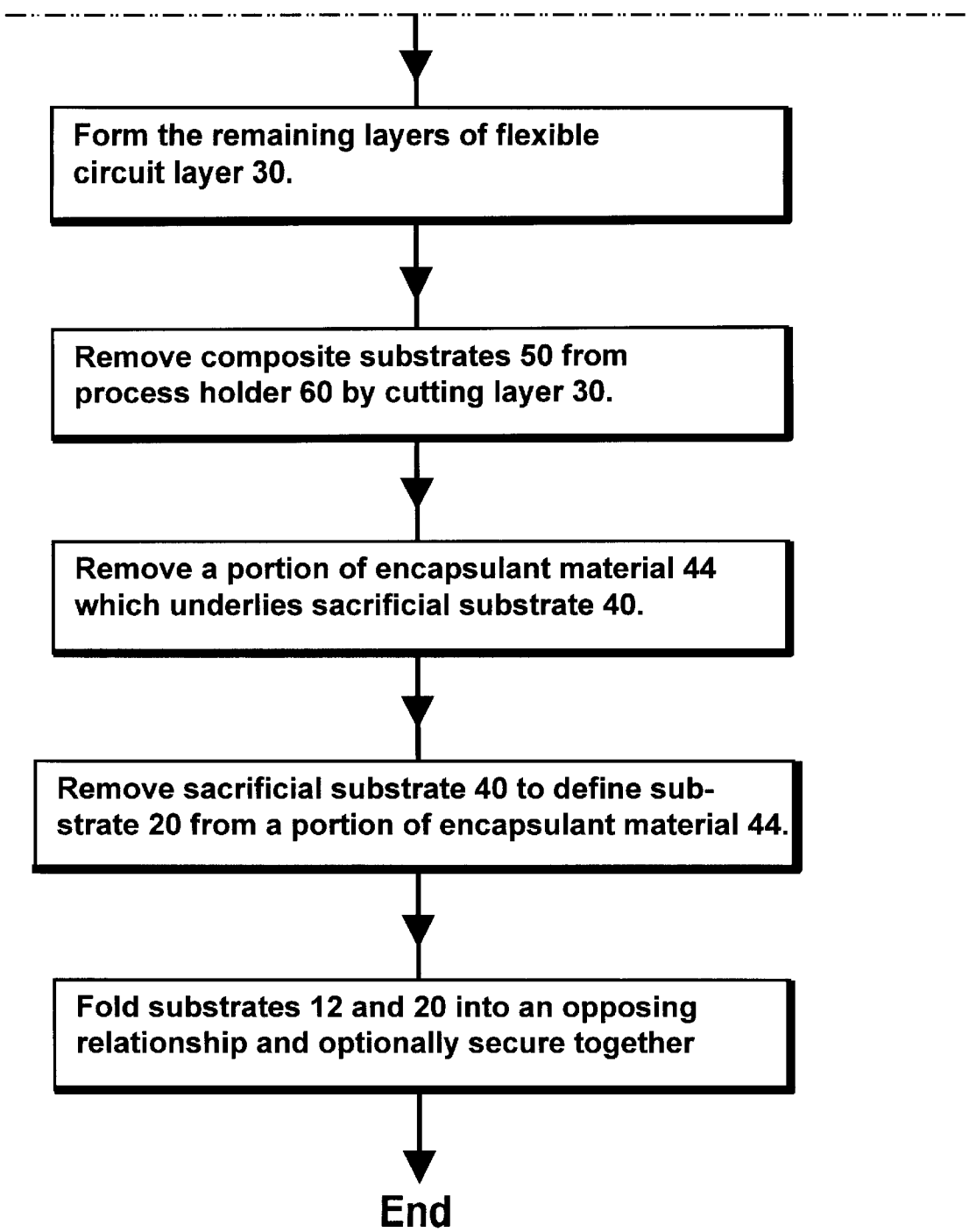
FIG._20B

REDUCED STRESS AND ZERO STRESS INTERPOSERS FOR INTEGRATED-CIRCUIT CHIPS, MULTICHIP SUBSTRATES, AND THE LIKE

FIELD OF THE INVENTION

The present invention relates to interposers that are used to electrically connect various types of substrates to one another, such as to connect integrated-circuit chips to multichip substrates (e.g., multichip modules or printed-circuit boards), or to connect multichip substrates to various types of substrates, such as printed-circuit boards and other multichip substrates.

BACKGROUND OF THE INVENTION

The present invention is applicable to the electronics packaging arts where several integrated-circuit (I.C.) chips are mounted to one or more substrates, and are interconnected to one another and other components through electrical traces carried by the substrates. The substrates may range from multichip modules, which may hold a few chips to tens of chips, to printed-circuit boards, which may hold tens of chips to hundreds of chips. The chips may be mounted to either multichip modules or printed-circuit boards, and multichip modules are sometimes mounted to printed-circuit boards (at the opposite surface from where the chips are mounted). The chips may be interconnected to one another to form any type of electronic digital system, analog system, or combined analog-digital system, as the application may require. The present invention is not limited to any type of application, or any types of substrates. (As used herein, the term "electrical component" encompasses integrated circuits, multichip modules, printed-circuit boards, and the like.)

Usually, an interposer is needed between an integrated-circuit chip and a main interconnect substrate. A typical prior art interposer comprises a single substrate that is positioned between the chip and the main interconnect substrate, and a plurality of electrical connectors which convey electrical signals between the chip and the main interconnect substrate. Typically, the connector comprises a set of solder bumps that are disposed on corresponding pads on each surface of the interposer, with these solder bumps being reflowed so as to connect to corresponding pads on the I.C. chip and main interconnect substrate. There are a plurality of vias formed through the interposer's substrate, each via providing an electrical path between two pads on respective surfaces of the interposer's substrate.

The purpose of the interposer is to provide a tested and reliable package of one or more integrated circuits which can be mounted on the main interconnect substrate in known working condition. The pretesting of the chip reduces the need for reworking of the main interconnect substrate that would normally occur if the chips were directly mounted to the main interconnect substrate. Also, the interposer can accommodate the phenomenon of "I.C. shrink" so there is no need to redesign the layout of the main interconnect substrate when the dimensions of the I.C. chips shrink or change. The "I.C. shrink" phenomenon is the replacement of an existing chip with a smaller chip at a later time by the manufacturer, usually in one to two years. Due to advances in semiconductor processing techniques, the dimensions of transistor devices have progressively decreased over the last three decades. By all indications, these dimensions will continue to decrease in the coming years. Decreasing the size of the transistors enables the chip manufacturer to provide the same circuit functionality on a smaller chip.

When the I.C. chip is powered on and off, prior art interposers often have the problem that their dimensions expand and contract at a different rate than the dimensions of either the I.C. chip or the main interconnect substrate. This difference causes mechanical stresses to be applied to the sets of solder bumps (or other connectors) that are disposed on the two surfaces of the interposer, particularly those bumps that are disposed near the edges of the interposer. This same problem occurs when the I.C. chip is directly mounted to a main interconnect substrate, and is due to the fact that the I.C. chip and the main interconnect substrate are made from different materials which usually have different coefficients of thermal expansion (abbreviated in the art as "CTE"). For example, silicon chips have a CTE of 2.5 ppm/° C., whereas conventional printed-circuit boards have CTEs of between 16 ppm/° C. and 18 ppm/° C. (ppm represents "parts-per-million", $1 \times 10^{-6}$). If the chip and the main interconnect substrate do not have the same CTE, then the interposer cannot have a CTE which is the same for both the chip and the main interconnect substrate. In the typical case where the I.C. chip and the main interconnect substrate have different CTEs, the interposer will usually have a CTE which is somewhere in the range between the CTEs of the chip and main board, and may even have the same CTE as either the chip or the main board.

By thermal simulation or experimental measurement, one can determine the steady-state temperatures of the I.C. chip, interposer, and the main interconnect substrate for typical operating conditions. With this information and the CTE values of the chip and the main interconnect substrate, one can select a CTE value (and corresponding material composition) for the interposer which causes the thermally-induced stress to be equally distributed among the two sets of solder bumps on either surface of the interposer. While this approach balances the stresses that occur during steady-state conditions, it does not fully minimize the stresses that occur during power-on and power-off conditions, where the temperatures of the components are undergoing transient changes before reaching their steady-state values. Considerable stress can occur during these times, which can cause the solder bumps to fail (due to metal fatigue) after a number of power-on/off cycles, regardless of the stresses that are present during steady-state operations.

Accordingly, there is a need for further improving the thermally-induced stress characteristics of interposers.

SUMMARY OF THE INVENTION

The present invention encompasses interposers capable of electrically coupling a first electrical component to a second electrical component and methods for making such interposers. An exemplary interposer according to the present invention comprises a first substrate and a second substrate, each substrate having a first surface, a second surface, and a respective coefficient of thermal expansion (CTE), as measured at the substrate's respective first surfaces. The exemplary interposer further comprises a plurality of electrical connection areas located over the first surface of the first substrate, another plurality of electrical connection areas located over the first surface of the second substrate. The exemplary interposer further comprises a flexible-circuit layer disposed between each of the first and second substrates, and having a first portion attached to the first surface of the first substrate and a second portion attached to the first surface of the second substrate. The exemplary interposer further comprises a plurality of electrical traces, each trace having a first end located at a connection area over the first substrate, and a second end located at a connection area over the second substrate, with each trace passing through the flexible-circuit layer. The trace ends, which are located at the connection areas, are capable of receiving connectors that will convey electrical signals to the electrical components that are disposed on either side of the interposer.

The coefficients of thermal expansion of the first and second substrates are different from one another (as measured at the first surfaces of the substrates), and are selected to reduce the mechanical stresses of the connectors that are to be mechanically coupled to the trace ends of the interposer.

General methods of making the interposers comprise the step of encapsulating a first substrate and a sacrificial substrate in an encapsulant material to form a composite substrate. The second substrate may be formed from a portion of the encapsulate material, or may be provided by a separate substrate that is encapsulated along with the first substrate and the sacrificial substrate. A first surface of the composite substrate may be polished, and a dielectric layer is formed over the first surface of the composite substrate. A plurality of electrical traces are formed over the dielectric layer. Additional alternating layers of dielectric and metal may be formed over the electrical traces. A portion of the composite substrate at its back surface is removed to expose a surface of the sacrificial substrate, and the sacrificial substrate is removed.

Accordingly, it is an object of the present invention to reduce thermally-induced stress on the connectors that are coupled to interposers.

It is another object of the present invention to enable the increase in the area of a chip that can be electrically connected to a printed-circuit board, multichip module substrates, or the like having a different coefficient of thermal expansion.

It is a further object of the present invention to enlarge the selection of solders and other connection materials which may be used to electrically couple chips, printed-circuit boards, multichip modules substrates, and the like to one another.

These and other objects of the present invention will become apparent to those skilled in the art from the following detailed description of the invention, the accompanying drawings, and the appended claims.

BRIEF DESCRIPTION OF THE DRAWINGS

FIG. 1 shows a side view of a first exemplary interposer according to the present invention.

FIG. 2 shows a top plan view of the interposer of FIG. 1 in an unfolded position according to the present invention.

FIG. 6 shows a top plan view of the exemplary interposer shown in FIG. 5 according to the present invention.

FIGS. 7–18 show side views of various components during various steps of an exemplary construction method according to the present invention.

FIG. 19 shows a perspective view of another exemplary sacrificial substrate according to the present invention.

FIGS. 20A–B show a flow diagram of construction steps according to an by exemplary method of constructing an exemplary interposer according to the present invention.

DETAILED DESCRIPTION OF THE INVENTION

Figure 3:
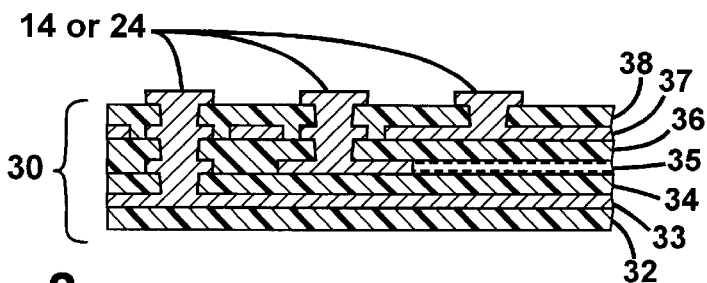
FIG. 3 shows a cross-sectional view of an exemplary flexible-circuit layer according to the present invention.

FIG. 1 shows a side view of a first exemplary interposer according to the present invention at reference number 10. Interposer 10 is capable of electrically coupling two electrical components to one another, where the electrical components are designated as reference numbers 1 and 5 in the figures. As an example, and without limitation on the present inventions, electrical component 1 may comprise an integrated-circuit chip and electrical component 5 may comprise a main interconnect substrate such as multichip module substrate, a printed-circuit board, or the like. As used herein, the term "electrical component" is any electrical or electronic component which has a flat surface where electrical pads, connectors, and/or ends of electrical traces are present.

Interposer 10 comprises a first substrate 12, a second substrate 20 separate from said first substrate 12, and a flexible-circuit layer 30 disposed and spanning between the two substrates 12 and 20. Each of substrates 12 and 20 has a first surface, a second surface, and a respective coefficient of thermal expansion. Flexible circuit layer 30 has a first portion which is attached to the first surface of substrate 12 and a second portion which is attached to the first surface of substrate 20. Flexible circuit 30 is bent such that the substrates 12 and 20 confront one another at their second surfaces (i.e., the second surfaces of the substrates are opposite one another). The length of the portion of flexible-circuit layer 30 which spans between substrates 12 and 20 is typically short, usually between 0.4 cm and 2.0 cm, and more typically between 0.8 cm and 1.5 cm. This is sufficient to enable substrates 12 and 20 to be folded together. A body 18 of flexible adhesive (such as high-temperature silicone) may be used to secure the substrates 12 and 20 together, which minimizes the chances that flexible-circuit layer 30 can be torn by motion of the substrates. As another feature of the present inventions, which is described in greater detail below, the CTEs of substrates 12 and 20 are different, with the CTE of substrate 12 being chosen in view of the thermal expansion characteristics of electrical component 1, and with the CTE of substrate 20 being chosen in view of the thermal expansion characteristics of electrical component 5. For example, if substrate 1 is a heat-generating component, the CTE of substrate 12 may be selected to be within a few parts-per-million of elongation per degree Celsius rise in temperature (e.g., 2 ppm/° C.=2×10$^{-6}$/° C.) of the CTE of substrate 1.

FIG. 2 shows a top plan view of interposer 10 in an unfolded position and with the first surfaces of substrates 12 and 20 face up. Interposer 10 further comprises a first plurality of electrical connection areas 14 disposed over the first surface of first substrate 12, a second plurality of electrical connection areas 24 disposed over the first surface of second substrate 20, and a plurality of electrical traces 35 which run between areas on substrates 12 and 20 and which pass through flexible circuit 30. In the embodiment shown in FIG. 2, traces 35 are located within the interior of flexible-circuit layer 30, and are therefore shown with dashed lines in the top plan view of FIG. 2. Each electrical trace 35 has a first end which terminates at an electrical connection area 14 and a second end which terminates at an electrical connection area 24. Each trace end may comprise a standard metalization pad at its corresponding connection area. Electrical connections will be made between electrical component 1 and the trace ends at electrical connection areas 14 by a plurality of connectors 3, and likewise electrical connections will be made between electrical component 5 and the trace ends at electrical connection areas 24 by a plurality of connectors 7. Thus, interposer 10 is capable of electrically connecting signals from electrical component 1 to electrical component 5 by way of electrical traces 35 and connector 3 and 7, and has the advantage of using substrates 12 and 20 with different CTE values which may be chosen to reduce the thermally-induced stresses on connectors 3 and 7. (Throughout the figures used herein, the dimensions of the connectors 3 and 7 have been expanded to a greater degree than the dimensions of the other components in order to more clearly show them.)

In preferred embodiments of interposer 10, traces 35 are contained within flexible-circuit layer 30 (although they need not be). An exemplary structure of flexible-circuit layer 30 is shown by the expanded-view window of FIG. 1. It comprises four dielectric layers 32, 34, 36, and 38, an inner conductive layer 33 between dielectric layers 32 and 34, a layer of traces 35 between dielectric layers 34 and 36, and an outer conductive layer 37 between dielectric layers 36 and 38. In preferred embodiments, traces 35 are formed from a conductive layer (the "middle conductive layer") which is patterned to define traces 35. FIG. 3 shows a partial cross-sectional view of a portion of layer 30 which overlies substrate 12. A mirror image of the portion shown in FIG. 3 would be representative of a portion of layer 30 which overlies substrate 20 (with the exception that the spacing distances between the vertical vias may be different). Each end of each electrical trace 35 comprises a vertical via which extends from the middle conductive layer to the outer surface of flexible-circuit layer 30, and which passes through dielectric layers 36 and 38 and outer conductive layer 37. The top of the via is located at a corresponding electrical connection area 14 or 24, and may have a pad formed on top of it. The vias may be of the well-known "stacked" type (as shown in FIG. 3) or the well-known "staggered" type.

Also in preferred interposer embodiments, inner conductive layer 33 comprises a broad strip of conductive material for conveying a first power supply voltage (e.g., power or ground), and outer conductive layer 37 comprises a broad strip of conductive material for conveying a second power supply voltage (e.g., ground or power). Each broad strip covers substantially all of the surface area of flexible-circuit layer 30, and the broad strips act as AC ground planes for traces 35 since they are positioned on opposite sides of electrical traces 35. The configuration enables traces 35 to be made with controlled AC impedances, which is important in conveying high-frequency signals without reflections. As is known in the microwave stripline design art, the dimensions of the trace cross-section and the distances between the trace 35 and the AC ground planes determine the characteristic impedance of the trace. In general, the designer of the system will select the characteristic impedance based on criteria that are not related to the practice of the present invention, and the designer can then consult the design guidelines in the stripline design art to select suitable trace dimensions and spacing distances to the AC ground planes to achieve the selected impedance. The choice of impedance is not critical to the practice of the present invention.

There are also vertical vias which extend from inner conductive layer 33 to selected connection areas 14 and 24, and which pass through dielectric layers 34, 36, and 38 and outer conductive layer 37. There are also vias which extend from outer conductive layer 37 to selected areas 14 and 24, and which pass through dielectric layer 38. As is conventional practice in the art, each of the above vias which pass through outer conductive layer 37 is isolated from layer 37 (e.g., by forming an aperture or ring in the conductive material of layer 37, with the via passing through the aperture or ring). Additionally, traces 35 are routed to avoid contacting the vias that are being brought up from inner conductive layer 33.

In the present invention, there is no need for vias to be formed through either of substrates 12 or 20, and there is no need for active electronic components (e.g., transistors) to be formed on the surfaces of substrates 12 and 20. In preferred interposer embodiments, substrates 12 and 20 do not have vias or active electronic components formed in their bodies or on their surfaces. In other preferred interposer embodiments, there are no connections between traces 35 and the surfaces of substrates 12 and 20. In these embodiments, therefore, traces 35 are electrically isolated from substrates 12 and 20, and more particularly, they are electrically isolated from the surfaces of these substrates. However, it may be appreciated that one or more bypass capacitors may be formed on the first surface of substrate 12 (and/or substrate 20) with connections made to it from conductive layers 33 and 37. In such a case, the connection pads to the bypass capacitors usually are relatively thick (more than 20 $\mu$m) or usually comprise a conductive polish stop material (e.g., tungsten) so that the bypass capacitors will not be destroyed by various polishing processes that are used in exemplary construction methods of the present invention and which are described below. U.S. Pat. No. 5,872,696 to Peters, et al., and assigned to the assignee of the present application, discloses exemplary substrate capacitor structures which may be used.

It will be appreciated that, as used herein, an electrical connection area 14 or 24 is a place or location where an electrical connection from one electrical trace or pad can be made to another electrical trace or pad on an opposing substrate through any of the known connectors (or combinations thereof, or intermixtures thereof). Exemplary connectors are solder bumps, WITs (U.S. Pat. No. 5,334,804), BIPs (bonded interconnect process, U.S. Pat. No. 5,104,111), UNIAXs (U.S. Pat. No. 4,705,205), etc.

As used herein, a flexible-circuit layer, such as layer 30, is capable of being bent through 180° bend with a bending radius of 5 mm or less without breaking, and more preferably with a bending radius of 1 mm without breaking. As indicated above, the flexible-circuit layer comprises one or more metal layers, and one or more dielectric layers. A wide variety of metals are malleable (e.g., copper, aluminum, gold, silver) and layers of these materials can be bent at least once without breakage. Many dielectric materials, and in particular polymeric materials and polyimides, are elastic, and layers of these materials can be bent without breakage if their thicknesses are reasonably small (less than a few millimeters). Some amount of force is required to be applied to the layer to cause the bending in the flexible layer. As used herein, one layer is more flexible than another layer if it requires less force for the same amount of bending. In the present invention, flexible-circuit layer 30 is preferably more flexible than each of substrates 12 and 20.

As mentioned above, the coefficient of thermal expansion (CTE) values of substrates 12 and 20 are different. Because each of substrates 12 and 20 may comprise a composite substrate formed from two or more laminated layers (or substrates) of different material having different CTE values, we define the CTE of each of these substrates as being measured at the first surfaces of these substrates. To do this measurement, a line segment of length l may be marked-off on the first surface of the substrate, preferably going through the central area of the substrate surface, and the CTE value is measured as the normalized elongation ($\Delta l/l$) of the line segment cause by a one degree Celsius (C.) rise in temperature. In order to obtain an accurate measurement, one measures the normalized elongation over a several degrees C. rise ΔT in temperature (for example ΔT=50 degrees C.), and then divides the measured result by ΔT. There are also mathematical equations and simulation programs that can be used to determine the CTE of a composite substrate along its surfaces. In cases where a thin layer of an elastic material (having a low Young's modulus) is laminated to a thick and rigid substrate (having a high Young's modulus), the rigid substrate will set the CTE values at both surfaces of the substrate, and those values will be substantially equal to the surface CTE of the rigid substrate. The electrical components 1 and 5 also comprise multiple layers of different materials, which often have different CTE values. For the purposes of the present invention, we will measure the CTE of these components in a similar manner, making the measurement at the surface which is coupled to substrates 12 and 20. In the case where an electrical component comprises an I.C. chip, several very thin layers are formed on the active surface of the semiconductor material. The collective thickness of layers is typically less than the thickness of the semiconductor material, and the surface CTE of the chip can often be approximated as the surface CTE of the semiconductor material alone since the semiconductor material is very rigid (having a high Young's modulus).

In typical applications, one of the electrical components 1 or 5 will produce a greater amount of heat during operation than the other component. For purposes of discussion, and without loss of generality, we will assume that component 1 generates more heat than component 5. In this case, it will be important that the CTE value of substrate 12 be close to the CTE value of component 1. The difference in CTE values between component 12 and component 1 should be less than the difference in CTE values between substrate 20 and component 1, and/or should be less than the difference in CTE values between components 1 and 5. When component 1 comprises an I.C. chip, the CTE values of substrate 12 and component 1 should preferably be within 6 ppm/° C. of one another, and more preferably within 3 ppm/° C. or 4 ppm/° C. of one another. They, of course, may be identical or substantially identical (i.e., within 0.5 ppm/° C.), which may be accomplished by having substrate 12 comprise the same material as component 1.

It is often the case that there is a substantial temperature difference between the first surfaces of substrates 12 and 20, where the connectors 3 and 7 to components 1 and 5, respectively, are located. The temperature difference is typically caused by low heat conductivity values for substrates 12 and 20 and adhesive body 18 relative to those for connectors 3 and 7 and for components 1 and 5. Because of this, connectors 7 will often undergo less temperature variations. For this reason, the difference in CTE values between substrate 20 and component 5 can be greater than the difference in CTE values between substrate 12 and component 1. In some constructed embodiments, the difference in CTE values between component 20 and component 5 is less than the difference in CTE values between substrate 12 and component 5, and/or is less than the difference in CTE values between components 1 and 5. In the case where the interposer is placed between a silicon I.C. chip and a typical printed-circuit board (with CTE of about 17 ppm/° C.), one prefers to have a difference in CTE values for substrates 12 and 20 of at least 5 ppm/° C., and more preferably of at least 10 ppm/° C. For example, substrate 20 may comprise copper, which has a CTE of 16.6 ppm/° C.

In other constructed embodiments, substrate 20 may comprise a material which enables it to be more elastic (i.e., to have a lower Young's modulus or lower bulk modulus) than substrate 12. The greater elasticity enables the CTE matching of substrate 12 with component 5 to be relaxed. For example, substrate 12 may comprise silicon for matching to a silicon I.C. chip and substrate 20 may comprise a common polyimide with a CTE of 40 ppm/° C. for matching to a circuit board which has a CTE of 18 ppm/° C. However, the polyimide material is approximately 40 times more elastic than the silicon, having a Young's modulus of 3×10⁹ Pascals (3 GPa) versus a. Young's modulus of 113×10⁹ Pascals (113 GPa) for silicon. Thus, when heated, substrate 20 will have substantially less stress with component 5 than a silicon chip which is directly attached to component 5.

Figure 4:
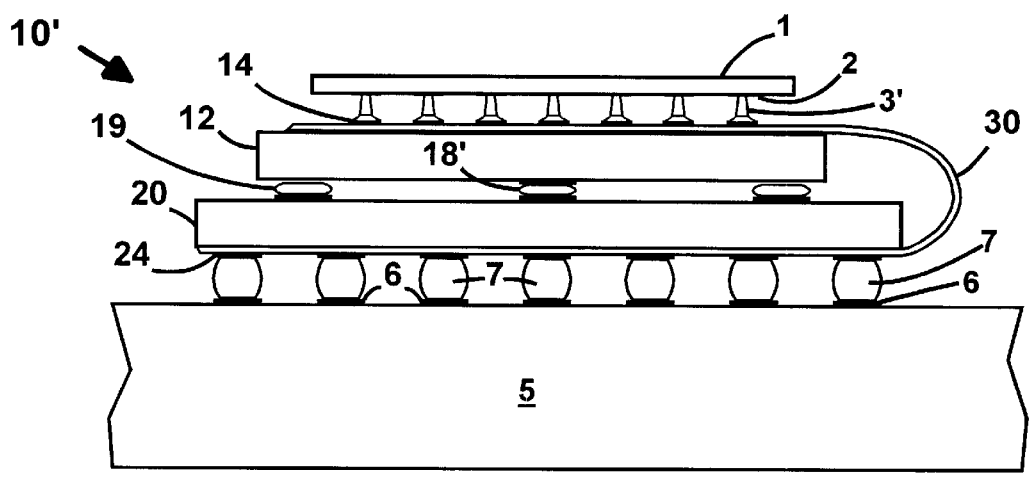
FIG. 4 shows a side view of a second exemplary interposer according to the present. invention.

A second exemplary interposer is shown at 10' in FIG. 4, which is a side view thereof. In this embodiment, WIT posts 3', as taught in U.S. Pat. No. 5,334,804, are used in place of solder bumps 3 to connect I.C. chip 1 to the pads 14 of substrate 12. (Throughout the figures used herein, the dimensions of the connectors 3' have been expanded to a greater degree than the dimensions of the other components in order to more clearly show them.) Except for adhesive body 18, interposer 10' comprises the same components as interposer 10 of FIG. 1, and the same reference numbers for these common components have been used in the figures. In place of adhesive body 18, a fixed solder bump connection 18' has been used to mechanically couple substrates 12 and 20 together. For this purpose, connection pads are formed on the back surfaces of substrates 12 and 20. Generally, connection 18' is provided at the centers of substrates 12 and 14, but this is not a required condition. As an option, stand-off solder bumps 19 may be added at one or more sides of connection 18' to provide stability against torque forces applied at the edges of substrates 12 and 20. Stand-off bumps 19 are only attached to one of substrates 12 and 20 (shown as substrate 20 for purposes of illustration) and thereby allow the substrates to move laterally with respect to one another under thermal heating and cooling.

Figure 5:
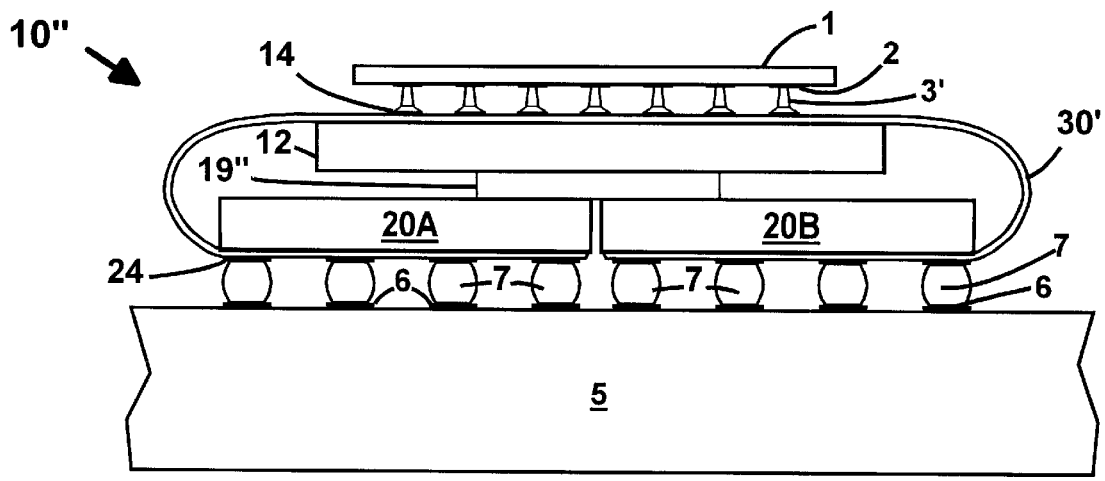
FIG. 5 shows a side view of a third exemplary interposer according to the present invention.

A third exemplary interposer is shown at 10" in FIG. 5, which is a side view thereof. Interposer 10" is similar to interposer 10' of FIG. 4, and shares common components as indicated by the common reference numbers. Interposer 10" differs from interposer 10' in that its substrate 20 is split into two sections 20A and 20B (which are really two separate substrates). The use of two separate substrate sections 20A and 20B provides the advantage of shortening the distance of the longest electrical traces 35. The electrical traces are more clearly seen in the top plan view of interposer 10" in FIG. 6, and their shorter distance may be seen by comparing FIG. 6 to FIG. 2.

Interposer 10" also differs from interposer 10' in that substrates 20A and 20B are attached to substrate 12 by a small portion of a substrate 19" which is disposed at the center the interposer (e.g., the center of substrate 12) in the manner shown in FIG. 6. The surface area of substrate 19" is typically one-quarter (¼) of, or less than, the surface area of substrate 12, and typically less than one-half (½) the surface area of either of substrates 20A and 20B. Because substrate 19" does not span the full width or length of substrate 12, it does not transmit the full amount of temperature-induced dimension changes of substrate 12 to substrate 20. Substrate 19" preferably comprises a material which does not melt or decompose under the solder reflow conditions needed to form connectors 3 and 7. Substrate 19" may comprise an epoxy bonding sheet, which are inexpensive and easy to apply.

It may be appreciated that the split substrate 20A and 20B may be used in the previous embodiments shown in FIGS.

1–4 where different connectors 3 are used and where different means for attaching substrates 12 and 20 are used.

The selection of CTE values for substrate 12 and 20 described above in the first exemplary embodiment may be applied to the second and third exemplary embodiments.

METHODS

Exemplary construction methods for interposers 10, 10', and 10" according to the present inventions are described with reference to FIGS. 7 through 19, which show side views of various components during construction, and in FIG. 20, which provides a flow diagram of the primary steps.

Referring to FIG. 7, first substrate 12 and a sacrificial substrate 40 are placed in a mold 42, preferably to one side thereof, where a liquefied form of an encapsulant material 44 will be poured and molded around the substrates, as is shown in FIG. 8. The chips may be held at the bottom of the mold by vacuum ports, or by applying small amounts of the liquefied form of the encapsulant material or compatible adhesive to the substrate surfaces or to the locations where they will be placed before the substrates are placed in the mold. In some embodiments, substrate 20 will be formed from the encapsulant material 44; in other embodiments, a substrate 20' of a solid material, such as copper, is placed adjacent to sacrificial substrate 40 for substrate 20 (as indicated by the dashed outline of FIG. 7). Once encapsulant material 44 is poured (FIG. 8), it is set or cured by means appropriate for its composition (e.g., heat, time, ultraviolet radiation, other forms of radiation, or combinations of these steps). Exemplary materials and curing methods are described below. The curing step results in forming a composite substrate 50 (see FIG. 9) which contains substrates 12 and 40 (and 20' if used) encapsulated by the cured material 44.

Preferred interposer embodiments are constructed to withstand the high temperatures of soldering. Because of these high temperatures, thermoplastic materials (i.e., materials which liquefy upon heating and set upon cooling, and which have the same chemical structure in the liquid and solid states) are not generally useful for these preferred embodiments. Instead, materials which undergo a chemical transformation to reach a solidified state upon curing, such as epoxies and polyimides, are preferred. In these cases, we call the liquefied form of the encapsulant material "the pre-cursor encapsulant material", or simply the pre-cursor.

The portion of flexible-circuit layer 30 which is bent between substrates 12 and 20 will be formed in later steps over sacrificial substrate 40. Sacrificial substrate 40 will be removed near the end of processing; but before it is removed, sacrificial substrate 40 will protect flexible-circuit layer 30 from a processing step to remove cured or set encapsulant material 44 that lies above it. As examples, sacrificial substrate may comprise copper or aluminum.

Mold 42 is typically used only once. Mold 42 may comprise glass, in which case it is broken after the curing step to release the molded composite substrate 50. Mold 42 may also comprise metal, in which case it is etched (usually with an acid) to release substrate 50. Mold 42 is preferably a shallow, rectangular mold, having a depth of approximately 4 mm to 6 mm.

Currently, polyimide precursors are preferred for the liquefied form of the encapsulant material 44. Upon curing, these precursors become polyimide, which is a polymeric material that can withstand high processing temperatures (typically up to 500° C.) without melting or decomposing, is resistant to many processing solvents and etchants, and is not brittle.

In constructed embodiments of the present invention, several different types of polyamic acids have been used for the liquefied form of the encapsulant material 44. These acids are polyimide precursors, and upon heating and/or exposure to certain types of radiation they convert their chemical structure to polyimide, as is well-known in the art. This step is called imidization, or curing. The polyamic acids that have been used are Du Pont's PI-2555, PI-2525, PI-2560, and PI-2611. These polyamic acids comprise high molecular-weight polymer chains, and shrink by approximately 30% upon curing (particularly in the case of the condensation-type polyamic acids). In the cured polyimide form, they are not brittle and have elongations of more than 17% at the material breaking point. Hitachi's PIQ and PIX polymer products may also be used.

In order to promote their adhesion to the cured polyimide, a thin layer (e.g., 200 Å) of chromium metal (or other adhesion material) may be formed over the surfaces of substrates 12, 20', and 40.

In general, many of the commercially available polyamic acids are liquefied by an organic solvent, such as N-methyl-pyrrolidone (NMP). The solvent can typically be up to 85% by weight of the liquefied polyamic acid. To achieve a thick encapsulant layer with a liquefied form of the polyamic acid that has a high solvent content, two or more filling (pouring) steps are used, with a solvent evaporation step in between the filling steps. The solvent evaporation steps are typically done at low temperatures (under 110° C.). Once the polyamic acid has been filled in the mold to the desired level, any remaining organic solvent is removed by a more rigorous evaporation process before the polyamic acid is cured. In preferred methods of construction, this evaporation step is conducted under a vacuum and the polyamic acid and remaining solvent in the mold are heated in several temperature steps (e.g., 60° C., 90° C., 120° C., 150° C., 180° C.) and kept at each temperature step several minutes to half an hour to drive out much of the remaining solvent. A vacuum oven may be used for this step. The polyamic acid is then cured at a temperature of at least 300° C., and more preferably of at least 350° C., for a time of 1 to 2 hours.

The polyamic acid undergoes shrinkage in the evaporation and curing steps. An extra amount of liquefied polyamic acid may be poured into the mold to compensate for the shrinkage. Also, a powdered inert material, such as powdered silicon or glass, may be added to the liquefied polyamic acid to reduce the amount of shrinkage. In preferred embodiments, the final cured thickness of the encapsulant in the area where second substrate 20 will be formed is between 2 mm and 3 mm. Accounting for shrinkage of 30% to 60% due to solvent evaporation and curing, the liquefied form of the encapsulant is typically poured to a thickness of 3 mm to 6 mm. Because substrates 12 and 40 do not shrink during the evaporation and curing step, the thickness of the molded composite substrate will be greater over substrates 12 and 40 than over the area where substrate 20 is formed. This difference is typically equal to between 40% and 60% of the thicknesses of the substrates 12 and 40, which are usually around 1.0 mm in thickness. Thus, in the typical case, there may be less than a 0.6 mm variation in the thickness of the cured composite substrate, which would be less than a 30% variation in its thickness if the poured thickness is 6 mm, and less than a 20% variation if the poured thickness is 3 mm. As described below, the variation in thickness may be reduced and substantially eliminated by polishing or lapping one or both surfaces of the composite substrate 50. The extent of the thickness variation is reduced with the use of substrate 20'. Nonetheless, the gaps between substrates 12, 40, and 20' will have smaller thicknesses.

Many polyimides have CTE values in the range of 30 ppm/° C. to 50 ppm/° C., which are higher than typical epoxy FR4 printed-circuit boards (e.g., 17 ppm/° C.). If substrate 20 is to be made from the encapsulant material 44, and if the CTE value of the encapsulant is too high, then a powdered filler material having a low CTE value (such as powdered glass or silicon) may be mixed with the liquefied form of encapsulant before it is poured. It should be noted that some polyimide materials, particularly flourinated polyimides, have CTE values in the range of 3 ppm/° C. to 6 ppm/° C. If these polyimides are to be used for the encapsulant, and if it is desirable to raise the CTE value of the cured encapsulant, then a powdered filler material having a high CTE value (such as powdered aluminum, with a CTE of 29 ppm/° C.) may be mixed with the encapsulant before the encapsulant is poured. The CTE of the composite material may be estimated by computing a weighted average of the two CTE values based on the percentage volumes of the powder and the encapsulant present in the composite material.

FIG. 9 shows a side view of the molded composite substrate 50 after it has been removed from the mold. This is after the mold is broken (such as in the case of a glass mold) or dissolved by etching (such as in the case of a metal mold). FIG. 9 shows an embodiment where substrate 20' is not used, and where substrate 20 is formed by the encapsulant 44. The top and bottom surfaces of composite substrate 50 are then preferably polished or lapped to planarize the surfaces and to expose the surface of substrate 12. A chemical-mechanical polishing step using an abrasive particulate (such as silica or alumina) may be used to polish the surfaces. The most uneven surface is preferably polished first. The result of the polishing steps is shown in FIG. 10 in a side view of composite substrate 50; and in a top plan view in FIG. 11. (FIGS. 10 and 11 show a dashed line to denote the case where substrate 20' is used.) Polishing fixtures, such as those used in SEM sample preparation, may be used to hold composite substrate 50 during the polishing processes. In the case where substrate 20' is used and substrates 12, 40, and 20' have substantially the same thickness, planarization may not be necessary, and the polishing step may be omitted.

Next, as shown in FIG. 12, two or more composite substrates 50 are placed in a processing holder 60 in preparation for forming flexible-circuit layer 30. (The composite substrate 50 on the left side does not have substrate 20', whereas the composite substrate 50 on the right side does.) Holder 60 comprises a flat plate, a plurality of recesses 62 for receiving corresponding composite substrates 50, and a plurality of pressure equalization ports 64 whose purpose will be explained below. The depth of each recess 62 is preferably close to the thickness of composite substrates 50, preferably within 0.5 mm. Next, as shown in FIG. 13, a polyimide film 32 is laminated over the top surfaces of composite substrates 50 and the top surface of process holder 60. This film corresponds to layer 32 of flexible-circuit layer 30 shown in FIGS. 1 and 3. Du Pont KAPTON may be used for this film. This laminated film holds the composite substrates 50 in place against process holder 60, and it may have a greater thickness than the other dielectric layers 34, 36, and 38 for this purpose.

Next, as shown in FIG. 14, a copper sheet 33 is laminated over the polyimide film 32. As another approach, the copper layer 33 may be formed by sputtering, by electroless plating, by electro-plating, or by a combination of such formation steps. In these cases, it is best to sputter a thin adhesion layer of chromium (e.g., 200 Å) before the copper layer is sputtered. It may be appreciated that one or more additional layers may be formed on dielectric film 32 before copper layer 33 is formed. Such additional dielectric layers may be formed by lamination, spin-coating, spray-coating, screening, and doctor blading. It may also be appreciated that one can initially laminate a metal film over the surfaces of composite substrates 50 and process holder 60 prior to laminating dielectric film 32.

Next, subsequent alternating layers of polyimide (34, 36, and 38) and copper (35 and 37) are formed by conventional lamination or build-up methods known to the art to complete the remaining layers of flexible-circuit layer 30. In the case of lamination, the polyimide layers 34, 36, and 38 are laminated in sheet form (i.e., film form) onto the process holder 60 and the composite substrates 50. Each such polyimide film is patterned to form the apertures for the conductive vias to layers 33, 35, and 37. This may be readily accomplished by punching the via apertures in the polyimide film before the film is laminated, or by laser drilling the via apertures, either before or after the polyimide film is laminated.

In the case that build-up methods are used to form dielectric layers 34, 36, and 38, liquified polyamic acid may be coated over the surfaces of composite substrates 50 and process holder 60 by spin coating, by a doctor blading (e.g, by squeegee), by screening, or by spray coating. After the coating operation, the solvent used to liquify the polyamic acid is evaporated off of the layer by conventional soft baking. The dried layer is then patterned to form the via apertures. As one approach, photo-imageable polyamic acid may be used and may be patterned by a conventional ultraviolet light exposure through a mask pattern followed by development. As another approach, a photoresist layer may be formed over the polyamic acid (after soft baking) and patterned to produce an etch mask. In this case, wet etching in a basic solution or dry etching (plasma etching) may be used. This approach is suitable if a non-imageable polyamic acid is used. Once patterned, the polyamic acid layer is cured to form a polyimide layer. As yet another patterning approach, the polyamic acid layer may be cured before being patterned, and the apertures may be formed in the polyimide layer by laser drilling or by plasma etching through a patterned photoresist layer.

Once the patterned polyimide layer has been formed or laminated, the via apertures of the polyimide layer are filled by sputtering conductive material (e.g., copper) or by plating conductive material. In the case of plating, electroless plating may be used, or electro-plating may be used if a conductive seed layer is first sputtered over the polyimide layer to provide a conductive path for the plating current. The seed layer usually comprises a thin chromium adhesion layer (e.g., 200 Å) followed by a thicker copper layer (e.g., 2 $\mu$m). In the case that the copper layer is formed by sputtering or by electro-plating with a seed layer, copper is deposited over the entire polyimide film, which fills the vias. Unwanted copper is removed by conventional chemical etching using masking caps over the newly filled vias. The masking caps can be easily formed with a layer of photoresist over the newly deposited copper layer, either by laminating (e.g., RISTON) or spin coating, and thereafter pattern exposing and developing the photoresist layer. Alternatively, for relatively large vias, the masking caps may be formed by screen printing, which may use a masking material that is not photosensitive. After the excess copper (and any seed layer) is etched away, the masking caps are removed by a suitable stripper. The vias may then be exposed to a brief chemical-mechanical polishing step with a soft pad to bring their level more flush with the level of the polyimide layer.

Subsequent copper layers 35 and 37 may be formed over polyimide layers by first sputtering a thin adhesion layer of chromium (e.g., 200 Å) and then sputtering a relatively thick layer of copper (e.g., 2 $\mu$m to 20 $\mu$m). If a thick layer of copper is desired, it may be more cost effective to sputter the first 2 $\mu$m of copper and complete the remainder of the layer by electroplating. After the copper layer is formed, another thin adhesion layer of chromium is deposited in order to provide good adhesion to a subsequent polyimide layer. Metal layer 37 is then pattern etched by conventional means to provide for apertures or rings around the vias that are to be formed to layers 35 and 33 below it. Metal layer 35 is pattern etched to define the electrical traces. The pattern etching usually includes a subtracting etch process where a patterned photoresist layer or mask layer is formed above those regions of the metal layer which are to be kept. A first etchant is used to remove the unwanted portions of the top adhesion layer, a second etchant (usually different from the first) is used to remove the unwanted portions of the copper material, and the first etchant is used again to remove the unwanted portions of the bottom adhesion layer (so as to prevent electrical shorts between traces and vias).

If electroplating is used after a thin copper layer is sputtered, then one may form a mask over the sputtered copper before the plating operation to thereby plate copper only at locations where it is desired. After plating, an adhesion layer of chromium having a greater than normal thickness (e.g., 600 Å) should be sputtered over the plated copper in anticipation of forming the next polyimide layer. The plating mask is then removed and the portions of the thin sputtered copper layer which were previously under the mask may be removed by performing a brief blanket copper etch. Additionally, the portions of the thin adhesion layer (e.g., 200 Å) that were under the mask are removed by a corresponding brief blanket etch to prevent electrical shorts. This etch will also etch the adhesion layer above the newly patterned copper layer, but the time of the etch is selected to remove the bottom adhesion layer while not completely removing the top adhesion layer.

As is known in the art, sputtering is performed with the substrate placed in a vacuum chamber. Ports 64 of process holder 60 enable the pressure to be equalized on both sides of the layers of flexible-circuit layer 30 during sputtering operations. If plating steps are used, ports 64 are covered over with adhesive tape prior to placing holder 60 in the plating bath.

FIG. 15 shows a side view of process holder 60, showing complete formation of the flexible-circuit layers 30 over the composite substrates 50, and FIG. 16 shows a top plan view thereof. It may be appreciated that for some applications, the flexible circuit layers 30 can comprise a single metal layer of electrical traces and one or two dielectric layers. Referring to FIG. 16, the composite substrates 50 are removed from the process holder by cutting through the flexible-circuit layers 30 with a cutting device 66 in the gaps between each composite substrate 50 and the process holder 60 at the edges of recess 62 that holds the composite substrate. From the above, it may be appreciated that process holder 60 enables several composite substrates 50 to be processed at one time to form the corresponding flexible-circuit layers 30. Once the composite substrates 50 are removed, the process holder is milled (e.g., exposed to a plasma etch) to removed the residual of layer 32 that remains on the top surface of the holder and along the edges of recesses 62.

It may be appreciated that for simple applications, the flexible circuit layers 30 can comprise one or two metal layers of electrical traces and one or two dielectric layers, and that these layers may be laminated together before hand before the group of layers is laminated onto a composite substrate 50.

Referring to FIG. 17, the portion of the encapsulant material 44 which underlies sacrificial substrate 40 is removed. Removal may be accomplished by sandblasting from the backside of the composite substrate (using a masking plate-to protect substrate 12 and 20) or by milling. The sandblasting or milling operation may be carried out such that a thin layer of sacrificial substrate 40 is removed. It may also be carried out such that the removal operation stops just short of reaching sacrificial substrate 40, with the remaining encapsulant material being removed by an oxygen plasma etching operation. In each approach, sacrificial substrate 40 protects flexible-circuit layer 30 from being damaged by the process for removing this portion of the encapsulant material 44.

Once the sacrificial substrate 40 is exposed, it may be removed by etching (i.e., dissolving in a chemical etchant). FIG. 18 shows a side view of composite substrate 50 after the removal of sacrificial substrate 40. As indicated above, exemplary materials for sacrificial substrate 40 are silicon, aluminum, and copper. Several etchants for these materials are known in the art. For example, a hot potassium hydroxide solution (KOH) or the combination of hydrofluoric and nitric acids may be used to dissolve a silicon substrate 40. The composition of each of these etchants is well-known in the semiconductor processing art. Hydrochloric acid (HCL) may be used to dissolve an aluminum substrate 40, and ammonium sulfate $((NH_4)_2SO_4)$ may be used to dissolve a copper substrate 40. Most polymer materials, and polyimide materials in particular, are resistant to acids and to bases of weak and moderate strength. Accordingly, the above etchants do not attack the molded portion 44 of the composite substrate 50 to any measurable degree. However, metal pads or trace ends on the top of flexible-circuit layer 30 should be protected from the etchant. This can be easily accomplished by coating the top surface of layer 30 with black wax or a resist prior to the etching step. Such protection measures are well-known to the etching art and are easily accomplished by the ordinary skill of the art. After the etching step, the black wax or a resist may be removed by conventional organic solvents, which do not attack cured polyimide layers or metals. Layers of other protective materials may of course be used, such as many photoresists.

The removal of sacrificial substrate 40 more clearly defines substrate 20 in the case where substrate 20 is formed from the encapsulant material 44. After sacrificial substrate 40 is removed, substrates 12 and 20 may be anchored to one another at their back surfaces by any of the approaches described above.

It may be appreciated that dissolving sacrificial substrate 40 in an etch represents a considerable use of chemical reagent and, accordingly, some expense. One approach to reducing this expense is to wrap one or more thin foils 47 and 48 of metal around sacrificial substrate 40, as shown in the perspective view of FIG. 19, before the sacrificial substrate is encapsulated by material 44. Foils 47 and 48 are not adhered to substrate 40. The double wrapping ensures that the liquefied form of the encapsulant 44 does not leak into the wrapping and deposit itself between substrate 40 and foil 47, which could possibly lead to foil 47 being adhered to substrate 40 upon the subsequent curing or setting of the liquefied form of encapsulant 44. Upon milling the molded composite substrate 50 to expose sacrificial substrate 40 (FIG. 17), the thin metal layers will be exposed at the backside of substrate 40, and can be removed by milling, sandblasting, or simple cutting. With layers 47 and 48 removed at the backside, sacrificial substrate 40 can simply be lifted out and removed since it is not adhered to layer 47. The remaining portions of layers 47 and 48 may be etched away, or in some cases may be left in place (preferably with the remaining rough edges being trimmed away).

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An interposer for electrically coupling a first electrical component to a second electrical component, said interposer comprising:
    a first substrate having a first surface, a second surface, and a first coefficient of thermal expansion as measured at its first surface;
    a second substrate separate from said first substrate, said second substrate having a first surface, a second surface, and a second coefficient of thermal expansion as measured at its first surface, said second coefficient of thermal expansion being different from said first coefficient of thermal expansion;
    a plurality of electrical connection areas located over the first surface of the first substrate;
    a plurality of electrical connection areas located over the first surface of the second substrate;
    a flexible-circuit layer disposed between each of said first and second substrates and having a first portion attached to the first surface of said first substrate and a second portion attached to the first surface of said second substrate; and
    a plurality of electrical traces, each said trace having a first end located at a connection area over said first substrate, having a second end located at a connection area over said second substrate, and passing through said flexible-circuit layer.

2. The interposer of claim 1 wherein the difference between the coefficients of thermal expansion of said first and second substrates is at least 5 ppm/° C.

3. The interposer of claim 1 wherein the difference between the coefficients of thermal expansion of said first and second substrates is at least 10 ppm/° C.

4. The interposer of claim 1 wherein a first electrical component is electrically coupled to said first substrate at the first surface of said first substrate, wherein said first electrical component has a coefficient of thermal expansion as measured at the surface at which it is coupled to the first substrate, and wherein the coefficients of thermal expansion of said first substrate and the first electrical component are within 0.5 ppm/° C. of one another.

5. The interposer of claim 1 wherein a first electrical component is electrically coupled to said first substrate at the first surface of said first substrate, wherein said first electrical component has a coefficient of thermal expansion as measured at the surface at which it is coupled to the first substrate, and wherein the coefficients of thermal expansion of said first substrate and the first electrical component are within 4 ppm/° C. of one another.

6. The interposer of claim 1 wherein a first electrical component is electrically coupled to said first substrate at the first surface of said first substrate, wherein said first electrical component has a coefficient of thermal expansion as measured at the surface at which it is coupled to the first substrate, and wherein the coefficients of thermal expansion of said first substrate and the first electrical component are within 6 ppm/° C. of one another.

7. The interposer of claim 1 wherein a second electrical component is electrically coupled to said second substrate at the first surface of said second substrate, wherein said second electrical component has a coefficient of thermal expansion as measured at the surface at which it is coupled to the second substrate, and wherein the coefficients of thermal expansion of said second substrate and the second electrical component are within 6 ppm/° C. of one another.

8. The interposer of claim 7 wherein the difference between the coefficients of thermal expansion of said first and second substrates is at least 5 ppm/° C.

9. The interposer of claim 1 wherein a first electrical component is electrically coupled to said first substrate at the first surface of said first substrate, wherein said first electrical component has a coefficient of thermal expansion as measured at the surface at which it is coupled to the first substrate, wherein the difference between the coefficients of thermal expansion of said first substrate and said first electrical component is less than the difference between the coefficients of thermal expansion of said second substrate and said first electrical component.

10. The interposer of claim 9 wherein a second electrical component is electrically coupled to said second substrate at the first surface of said second substrate, wherein said second electrical component has a coefficient of thermal expansion as measured at the surface at which it is coupled to the second substrate, wherein the difference between the coefficients of thermal expansion of said second substrate and said second electrical component is less than the difference between the coefficients of thermal expansion of said first substrate and said second electrical component.

11. The interposer of claim 9 wherein the difference between the coefficients of thermal expansion of said first and second substrates is at least 5 ppm/° C.

12. The interposer of claim 1 wherein a first electrical component is electrically coupled to said first substrate at the first surface of said first substrate, wherein said first electrical component has a coefficient of thermal expansion as measured at the surface at which it is coupled to the first substrate;
    wherein a second electrical component is electrically coupled to said second substrate at the first surface of said second substrate, wherein said second electrical component has a coefficient of thermal expansion as measured at the surface at which it is coupled to the second substrate; and
    wherein the difference between the coefficients of thermal expansion of said first substrate and said first electrical component is less than the difference between the coefficients of thermal expansion of said first electrical component and said second electrical component.

13. The interposer of claim 1 wherein the second surfaces of said first and second substrates are disposed opposite to one another, and wherein said interposer further comprises an adhesive disposed between said second surfaces.

14. The interposer of claim 1 wherein the second surfaces of said first and second substrates are disposed opposite to one another, and wherein said interposer further comprises a first solder bump disposed between the second surfaces of said first and second substrates and adhered to both second surfaces.

15. The interposer of claim 14 wherein said interposer further comprises a second solder bump disposed between the second surfaces of said first and second substrates and adhered to only one of said second surfaces.

16. The interposer of claim 1 wherein the second surfaces of said first and second substrates are disposed opposite to one another, and wherein said interposer further comprises a third substrate adhered to and between the second surfaces of said first and second substrates, said third substrate having an area which is less than the area of at least one of said first and second substrates.

17. The interposer of claim 1 wherein said first substrate comprises silicon and said second substrate comprises copper.

18. The interposer of claim 1 wherein at least one of said substrates comprises a powder-filled encasulant material.

19. The interposer of claim 1 wherein said first substrate has a first Young's modulus, and wherein said second substrate comprises a cured encapsulant material and has a second Young's modulus which is lower than said first Young's modulus.

20. The interposer of claim 1 wherein said electrical traces are electrically isolated from at least one of said first and second substrates.

21. The interposer of claim 1 wherein said electrical traces are electrical isolated from the second surface of at least one of said first and second substrates.

22. The interposer of claim 1 wherein an integrated-circuit chip is electrically and mechanically coupled to the ends of said electrical traces at said first plurality of connection areas.

23. The interposer of claim 1 wherein said flexible-circuit layer is capable of being bent through a 180° angle bend, with a bending radius of 5 millimeters or less, without breaking.

24. The interposer of claim 1 wherein said flexible-circuit layer is more flexible than either of said first and second substrates.

25. The interposer of claim 1 wherein the thickness of said flexible layer is less than the thicknesses of either of said first and second substrates.

26. A method of constructing an interposer comprising the steps of:
   (a) encapsulating a first substrate and a second substrate in an encapsulant material to form a resulting composite substrate having a first surface and a second surface opposite to the first surface;
   (b) forming a dielectric layer over the first surface of the composite substrate;
   (c) forming a plurality of electrical traces on the dielectric layer;
   (d) after said steps (b) and (c) have been performed, removing a portion of the composite substrate at its second surface to expose a surface of the second substrate; and
   (e) after said step (d) has been performed, removing the second substrate.

27. The method of claim 26 wherein step (a) comprises the steps of placing the first and second substrates within a mold, filling the mold with a liquefied pre-cursor of the encapsulant material, and curing the pre-cursor to form the encapsulant material.

28. The method of claim 26 wherein said step (a) further comprises encapsulating a third substrate along with the first and second substrates, the second substrate being placed between the first and third substrates.

29. The method of claim 26 further comprising the step of polishing the first surface of the composite substrate prior to the step (b) of forming the dielectric layer.

30. The method of claim 29 wherein the step of polishing the first surface of the composite substrate exposes a surface of the first substrate.

31. The method of claim 26 wherein step (b) comprises the step of placing the composite substrate within a recess of a process holder prior to forming the dielectric layer, the process holder having a surface at which the recess is formed.

32. The method of claim 31 wherein said step (b) further comprises the step of laminating a dielectric film over the first surface of the composite substrate and a portion of the surface of the process holder, and wherein said method further comprises the step of removing the composite substrate from the recess, after the electrical traces are formed by step (c), by cutting through the laminated dielectric film around the perimeter of the composite substrate.

33. The method of claim 31 wherein the process holder has a pressure equalization port within each recess.

34. The method of claim 31 wherein said step (b) further comprises the step of laminating a dielectric film over the first surface of the composite substrate and a portion of the surface of the process holder prior to forming the dielectric layer, and wherein said method further comprises the step of removing the composite substrate from the recess, after the electrical traces are formed by step (c), by cutting through the laminated dielectric film and the dielectric layer around the perimeter of the composite substrate.

35. The method of claim 26 wherein said step (d) comprises at least one of the steps of milling, sandblasting, and cutting.

36. The method of claim 26 wherein said step (e) comprises the step of etching the second substrate.

37. The method of claim 26 further comprising the step, prior to performing step (a), of wrapping the second substrate in a material film which does not adhere to the second substrate, and wherein said step (d) comprises the step of removing the encapsulant material such that a portion of the material film is exposed, and wherein step (e) comprises cutting through the exposed portion of the material film to expose the second substrate and thereafter removing the second substrate away from the remainder of the material film.

38. A method of constructing an interposer comprising the steps of:
   (a) encapsulating a first substrate and a second substrate in an encapsulant material to form a resulting composite substrate having a first surface and a second surface opposite to the first surface;
   (b) placing the composite substrate within a recess of a process holder, the process holder having a surface at which the recess is formed;
   (c) forming a material layer over the first surface of the composite substrate and a portion of the surface of the process holder;
   (d) forming a plurality of electrical traces over the material layer;
   (e) removing the composite substrate from the recess, after the electrical traces are formed by step (d), by cutting through the laminated dielectric layer around the perimeter of the composite substrate;

(f) removing a portion of the composite substrate at its second surface to expose a surface of the second substrate; and (g) removing the second substrate.

39. The method of claim 38 wherein the material layer comprises dielectric material, and wherein said step (b) comprises the step of laminating a dielectric film over the first surface of the composite substrate and thereafter forming a dielectric layer over the dielectric film by at least one of the steps of spin coating dielectric material, spraying dielectric material, screening dielectric material, or doctor-blading dielectric material.

* * * * *